(12) United States Patent
Syed et al.

(10) Patent No.: US 11,966,636 B2
(45) Date of Patent: Apr. 23, 2024

(54) METHODS AND SYSTEMS FOR DYNAMIC COMPRESSION AND TRANSMISSION OF APPLICATION LOG DATA

(71) Applicant: INTUIT INC., Mountain View, CA (US)

(72) Inventors: Waseem Akram Syed, San Jose, CA (US); Jian Fang, Foser City, CA (US); Venkata Suresh Babu Chilluri, Cupertino, CA (US); Michelle Gu, San Francisco, CA (US); Nikita Prakash Patil, Mountain View, CA (US); Muralidhar Kattimani, San Jose, CA (US)

(73) Assignee: INTUIT INC., Mountain View, CA (US)

( * ) Notice: Subject to any disclaimer, the term of this patent is extended or adjusted under 35 U.S.C. 154(b) by 94 days.

(21) Appl. No.: 17/449,529

(22) Filed: Sep. 30, 2021

(65) Prior Publication Data

US 2023/0096637 A1 Mar. 30, 2023

(51) Int. Cl.
*G06F 3/06* (2006.01)
*G06F 1/28* (2006.01)
(Continued)

(52) U.S. Cl.
CPC ............ *G06F 3/0661* (2013.01); *G06F 1/28* (2013.01); *G06F 3/0608* (2013.01);
(Continued)

(58) Field of Classification Search
CPC .. G06F 11/0751; G06F 11/079; G06F 3/0661; G06F 3/0608; G06F 3/0647; G06F 3/067
See application file for complete search history.

(56) References Cited

U.S. PATENT DOCUMENTS 9,645,914 B1 * 5/2017 Zhang ........................ G06F 8/65
2013/0144968 A1 * 6/2013 Berger .................. G06Q 50/01
709/217

(Continued)

OTHER PUBLICATIONS

APPDYNAMICS, Mobile Real User Monitoring, https://docs.appdynamics.com/21.8/en/appdynamics-essentials, 2 pages.

(Continued)

*Primary Examiner* — Jigar P Patel
(74) *Attorney, Agent, or Firm* — Patterson + Sheridan, LLP

(57) ABSTRACT

Certain aspects of the present disclosure provide techniques for committing log data in an application to a log data repository. An example method generally includes receiving, from an application, data to be committed to a remote storage location. A type of the received data is determined. The type of the received data is generally associated with a prioritization level and a compression mechanism to be used in committing the data to the remote storage location. An application execution context associated with the received data is determined. At a dispatch time associated with the prioritization level of the received data and the application execution context associated with the received data, a compressed data payload is generated and transmitted to the remote storage location. Generally, to compress the data payload, at least the received data is generally compressed based on the determined compression mechanism.

19 Claims, 6 Drawing Sheets

(51) Int. Cl.
*G06F 11/07* (2006.01)
*H03M 7/30* (2006.01)

(52) U.S. Cl.
CPC ............ *G06F 3/0647* (2013.01); *G06F 3/067* (2013.01); *G06F 11/0751* (2013.01); *G06F 11/079* (2013.01); *H03M 7/30* (2013.01)

(56) References Cited

U.S. PATENT DOCUMENTS

| | | | |
|---|---|---|---|
| 2014/0375484 A1* | 12/2014 | Jin | H03M 1/002 341/87 |
| 2017/0163550 A1* | 6/2017 | Wu | H04L 51/214 |
| 2018/0032261 A1* | 2/2018 | Singhai | G06F 12/023 |
| 2019/0052522 A1* | 2/2019 | Makkiya | H04L 41/069 |
| 2019/0095138 A1* | 3/2019 | Sakurada | G06F 3/0664 |
| 2019/0251189 A1* | 8/2019 | VanderSpek | G06F 16/1756 |
| 2021/0076105 A1* | 3/2021 | Parmar | G06F 3/0425 |
| 2021/0274012 A1* | 9/2021 | George | H04L 67/02 |

OTHER PUBLICATIONS

Splunk>, Splunk MINT SDK for iOS Developer Guide, https://docs.splunk.com/Documentation/MintIOSSDK/5.2.x/DevGuide/AboutSplunkMINTSDKs, 2 pages.

Splunk>, Splunk MINT SDK for Android Developer Guide, https://docs.splunk.com/Documentation/MintAndroidSDK/5.2.x/DevGuide/AboutSplunkMINTSDKs, 2 pages.

* cited by examiner

METHODS AND SYSTEMS FOR DYNAMIC COMPRESSION AND TRANSMISSION OF APPLICATION LOG DATA

Aspects of the present disclosure relate to reducing data transmission overhead and improving transmission reliability for transmitted application log data.

BACKGROUND

Software applications can be consumed on a variety of devices, including desktop computers, laptops, tablets, smartphones, and the like. During execution of a software application, various events may be logged, and the log data may be committed to a log data repository. Generally, the log data repository may include a remote repository in which application log data, which may be anonymized so as to prevent personally identifiable information from being included in the log data committed to the remote repository and to minimize the risk of personally identifiable information from being recovered from the log data (e.g., in the event of a data loss event in which malicious parties obtain unauthorized access to the log data). This log data is generally used during the software development and maintenance process in order to identify errors in a software application (e.g., conditions under which the software application fails or otherwise generates unexpected results) or areas in the software application in which performance can be improved.

In some cases, application log data can be committed to a remote data repository in response to an occurrence of an event that triggered generation of the log data. For example, when an error occurs in the application, the occurrence of an error may trigger generation of the log data and transmission of the generated log data to a log data repository. In another example, an event may be expiration of a timer in which application data such as feature usage information, performance data, or other non-error-event data is transmitted to the log data repository. Generally, applications may attempt to transmit this data in the same manner (e.g., upon the occurrence of an event). Transmitting log data to a log data repository in the same manner, however, may increase transmission overhead for the transmission of log data. Further, transmission of the application log data to the log data repository may be a "fire-and-forget" operation in which the application log data is transmitted to the log data repository without guarantees that the log data is delivered, or may be an operation that continually attempts to deliver data regardless of the number of attempts that fail.

Thus, techniques are needed for efficiently communicating application log data in a software application.

BRIEF SUMMARY

Certain embodiments provide a computer-implemented method for committing log data in an application to a log data repository. An example method generally includes receiving, from an application, data to be committed to a remote storage location. A type of the received data is determined. The type of the received data is generally associated with a prioritization level and a compression mechanism to be used in committing the data to the remote location. An application execution context associated with the received data is determined. At a dispatch time associated with the prioritization level of the received data and the application execution context associated with the received data, a compressed data payload is generated and transmitted to the remote storage location. Generally, to compress the data payload, at least the received data is generally compressed based on the determined compression mechanism.

Still further embodiments provide a computer-implemented method for failure-resistant committing log data in an application to a log data repository. An example method generally includes receiving, from an application, data to be committed to a remote storage location. A type of the received data is determined. The type of the received data is generally associated with a prioritization level and a compression mechanism to be used in committing the data to the remote location. An application execution context associated with the received data is determined. At a dispatch time associated with the prioritization level of the received data and the application execution context associated with the received data, a compressed data payload is generated and transmitted to the remote storage location. Generally, to compress the data payload, at least the received data is generally compressed based on the determined compression mechanism. It is determined that transmitting the compressed data payload to the remote storage location failed. Transmission of the compressed data payload is retried until one of receiving confirmation that the compressed data payload was successfully transmitted or reaching a threshold number of attempts to transmit the compressed data payload to the remote storage location.

Other embodiments provide processing systems configured to perform the aforementioned methods as well as those described herein; non-transitory, computer-readable media comprising instructions that, when executed by one or more processors of a processing system, cause the processing system to perform the aforementioned methods as well as those described herein; a computer program product embodied on a computer readable storage medium comprising code for performing the aforementioned methods as well as those further described herein; and a processing system comprising means for performing the aforementioned methods as well as those further described herein.

The following description and the related drawings set forth in detail certain illustrative features of one or more embodiments.

BRIEF DESCRIPTION OF THE DRAWINGS

The appended figures depict certain aspects of the one or more embodiments and are therefore not to be considered limiting of the scope of this disclosure.

To facilitate understanding, identical reference numerals have been used, where possible, to designate identical elements that are common to the drawings. It is contemplated that elements and features of one embodiment may be beneficially incorporated in other embodiments without further recitation.

DETAILED DESCRIPTION

Figure 1:
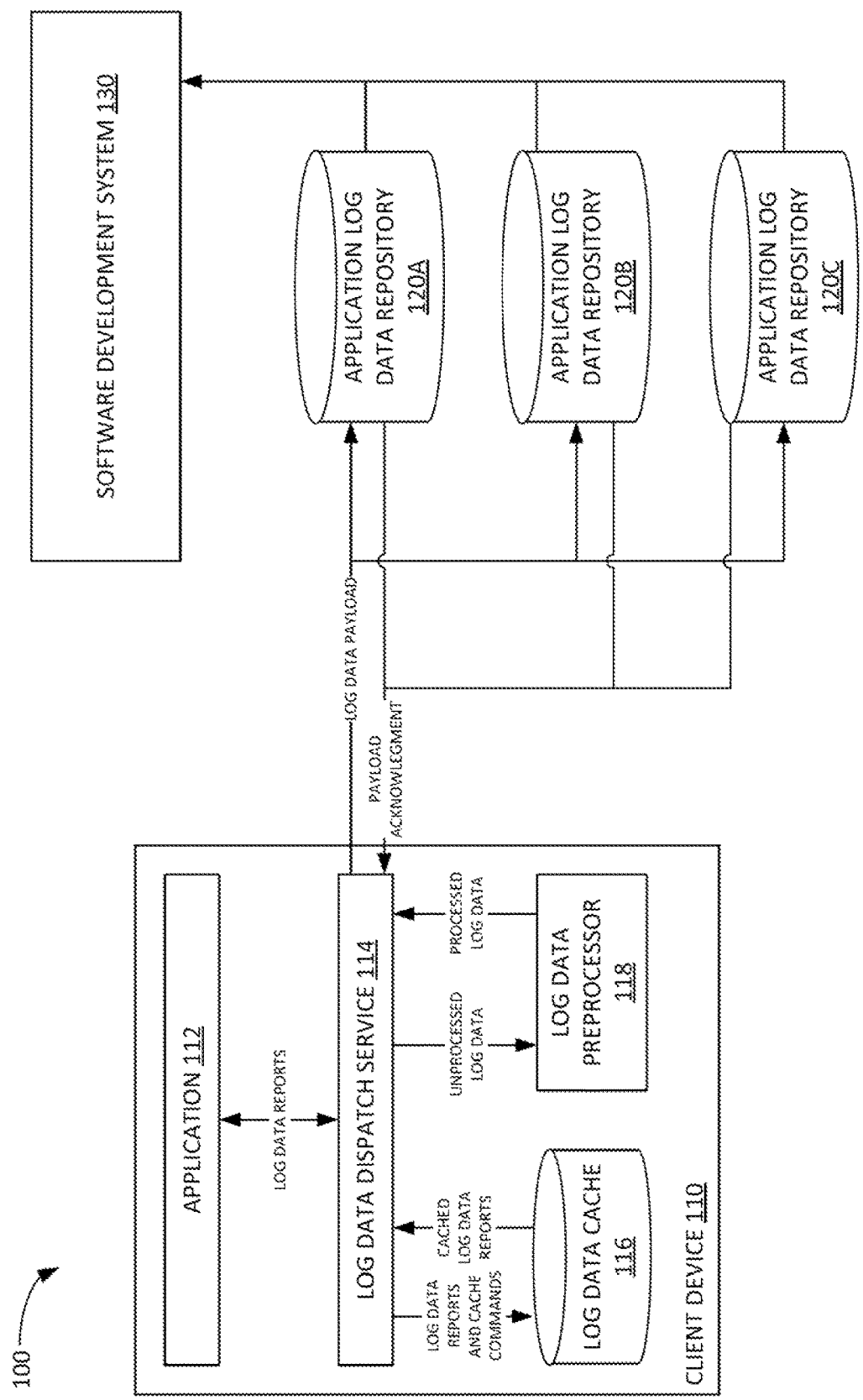
FIG. 1 depicts an example computing environment in which application log data is generated and transmitted to an application log data repository based on compression and timing associated with a type of the application log data.

In many software applications, application log data is used to identify errors in a software application and to provide operational information about the software application. The application log data can be used during the software development process for various purposes. For example, application log data associated with error events (e.g., unhandled exceptions causing the application to fail in an unexpected manner or handled exceptions causing the application to fail "gracefully" such that the application exits in a controlled manner or allows for continued execution) may be used to identify application code that should be corrected and updated. Application log data associated with typical application execution may be used, for example, to identify features in the application that are heavily used (and thus, should be subject to continued development) and features that are seldom used (and thus, may be removed from future releases of the software application).

Application log data may generally be committed to a remote log data repository when an event occurs in the software application. Generally, this log data is committed to a remote log repository because developers who maintain an application from which the application log data was received are generally distinct and located remotely from the users of the application. The application log data may be transmitted to the application log repository without guarantees of successful delivery of the log data. Because of the nature of the log data, some log data may be considered more important than other log data. For example, log data associated with errors in the software application may be considered more important than application usage data, as errors in the software application are generally events that trigger rapid updates in the software application, while usage log data may not trigger an immediate update to the software application. Despite differences in the importance of different types of application log data, many applications may not take into account these differences in transmitting application log data to a remote repository. Thus, software applications may not efficiently use network and processing resources for generating and transmitting application log data and may not reliably transmit the application log data to the remote repository.

Aspects of the present disclosure provide techniques for dynamic compression and transmission of application log data so that application log data is compressed and transmitted based on the type of the application log data. As discussed in further detail herein, different types of application log data may be transmitted and compressed so that more important application log data is transmitted with lower latency than less important log data and with increased reliability of transmission. Further, the application log data can be compressed prior to transmission to a remote log data repository. By dynamically compressing and transmitting application log data, aspects of the present disclosure may reduce the amount of computing resources used in generating and transmitting application log data to a remote log data repository and improve transmission reliability for the generated log data. For example, application log data associated with application errors may be transmitted with very low latency (e.g., upon occurrence of an error event, and in some aspects, without incurring a compression overhead or incurring a small compression overhead), while usage log data or other less important data may be transmitted with more latency and using compression mechanisms that result in higher degrees of data compression. In such a case, for data such as application log data associated with application errors, the processing overhead involved in compressing data into a smaller payload and decompressing the data, especially for large batches of application log records associated with an application log, may be omitted. Meanwhile, for log data that may only be used occasionally, increased processing overhead for compressing this log data may be offset by power and network resource savings achieved by transmitting and receiving smaller log data payloads.

Thus, aspects of the present disclosure may dynamically generate and transmit application log data to promote transmission reliability for application log data considered "important" and to reduce transmission overhead for application log data considered less "important" in the software development and maintenance process.

Example Dynamic Compression and Transmission of Application Log Data

FIG. 1 illustrates an example computing environment 100 in which application log data is dynamically compressed and transmitted to a remote storage location. As illustrated, computing environment 100 includes a client device 110 and a plurality of application log data repositories 120. While computing environment 100 illustrates dynamic compression and transmission of log data from a client device to one or more application log data repositories, it should be recognized by one of ordinary skill in the art that the techniques described herein may also or alternatively be implemented in applications deployed in cloud computing environments and exposed as a service to a client device 110 (e.g., as a web application, through a player application that allows a user to invoke functions in an application exposed as a service, or the like).

Client device 110 is generally representative of a computing device on which a user-facing client application can execute, such as a desktop computer, a laptop computer, a smartphone, a tablet, or other computing device. As illustrated, client device 110 includes an application 112, a log data dispatch service 114, a log data cache 116, and a log data preprocessor 118.

Application 112 generally represents an application that allows a user to invoke functions defined in a local executable and/or invoke functions at a remote application service executing on an application server (not illustrated) to perform various operations provided by an application. Generally, application 112 may present a user interface to a user of client device 110 and may execute various functions when defined events occur within the application. During execution in application 112, various events may occur that trigger the generation of application log data to be committed to one or more of application log data repositories 120A-120C. Generally, to commit application log data to the application log data repositories 120A-120C, application 112 can dispatch the application log data to log data dispatch service 114, which, as discussed in further detail below, dynamically compresses and transmits the application log data to one or more of the application log data repositories 120A-120C.

Generally, events which may trigger the generation and transmission of application log data may include, for example, the occurrence of handled or unhandled errors in the application, transitions between different states defined in the application, expiration of log event transmission timers in the application, or other events that may trigger the generation and transmission of log data from the application 112. Each of these events that trigger the generation and transmission of application log data to one or more of application log data repositories 120A-120C may be associated with a prioritization level to be used in transmitting the application log data to one or more of application log data repositories 120A-120C and a compression mechanism to be used in compressing the application log data (e.g., by log data preprocessor 118) prior to transmission to the one or more application log data repositories 120A-120C.

The application data that may be included in application log data provided by application 112 to log data dispatch service 114 may differ based on the type of the event that triggered generation of the application log data.

Log data reporting triggered by an error in the application may include, for example, information about a location in the application in which an error occurred (e.g., the function executing in the application when the error occurred), whether the error was handled (e.g., resulted in a failure that allowed an application to exit to a known state or allowed for continued execution of the application), a memory dump including information about the contents of system memory at the time of the error, and other relevant information.

Log data reporting triggered by a state transition from a source state to destination state in the application 112 may include, for example, a timestamp indicating when the event occurred, the source and destination states in the application, clickstream data captured while the user of application 112 was in the source state, and other relevant information.

Log data reporting triggered by the expiration of regular reporting timers in the application 112 may include usage information captured within application 112 (e.g., state transitions, clickstream data, and so on) captured from a previous time at which a timer expired and a current time corresponding to expiry of the timer.

In some aspects, the application log data provided by application 112 to log data dispatch service 114 may further or alternatively include application performance information. This application performance information, as discussed in further detail below, may indicate whether an application is in a failure state and may be used to determine a prioritization for transmission of the log data to application log data repositories 120A-120C.

Log data dispatch service 114 generally receives log data reports from application 112 in response to various events that occurred within application 122 and takes one or more actions to dynamically compress and transmit the application log data. Generally, the dynamic compression and transmission of the application log data may allow for log data associated with higher prioritization levels to be transmitted with lower latency (e.g., upon receipt, without waiting for other log data to be received for batch transmission) and/or less computationally expensive compression applied thereto. Meanwhile, log data associated with lower prioritization levels may be transmitted with higher latency (e.g., using batch transmission techniques in which multiple instances of log data reports generated over a time period are consolidated into a single transmission) and/or with more computationally expensive compression applied thereto (with corresponding increases in the amount of compression applied to the data). Further, as discussed in further detail below, log data dispatch service 114 may monitor transmission of the application log data to application log data repositories 120A-120C to determine whether to retransmit the data or transmit one or more instructions to instruct log data cache 116 to flush the data from log data cache 116, which may provide for increased transmission reliability of application log data and reductions in the use of computing resources when transmission of the log data repeatedly fails.

Generally, log data dispatch service 114 generates application log reports and transmits these application log reports to one or more application log data repositories 120A-120C according to a prioritization level of the log data reports and an application context associated with the log data reports. The application context may indicate, for example, that the application is in an error state or that the application is operating in an expected state, amongst other contexts that may be used in determining how log data reports received from application 112 are to be compressed and transmitted to application log data repositories 120A-120C.

In some aspects, log data dispatch service 114 can examine a received log data report from application 112 to determine the application context and an associated prioritization level of the log data report. For example, log data dispatch service 114 can determine whether the received log data report is indicative of a failure condition within application 112, and thus, that the application context corresponds to an application failure context. In some aspects, a failure condition may include the occurrence of a handled or unhandled exception in application 112. When the log data report includes performance information, such as timing information about an amount of time elapsed in order to perform an operation within application 112, log data dispatch service 114 can examine the timing information to determine whether the timing information is indicative of a failure condition within application 112. For example, an operation (e.g., execution of a function) within application 112 may be associated with a maximum time in which the operation should be completed. If the timing information indicates that the operation was completed within the defined maximum time for the operation, log data dispatch service 114 can determine that the timing information is not indicative of a failure condition. Otherwise, if the timing information indicates that the operation was completed after the defined maximum time for the operation, log data dispatch service 114 can determine that the timing information is indicative of a failure condition. Various other data points in the log data reports may also or alternatively be examined to determine whether the log data report is indicative of a failure of one or more components in the application.

When log data dispatch service 114 determines that the application context corresponds to an application failure, the log dispatch service 114 can determine that the dispatch time associated with the log data report corresponds to immediate dispatch to one or more of application log data repositories 120A-120C. Based on the determination that the application context corresponds to an application failure and the determined dispatch time, log data dispatch service 114 can immediately transmit a log data payload including the received log data report to one or more of application log data repositories 120A-120C. In some aspects, because the dispatch time associated with the application context corresponds to immediate dispatch, log data dispatch service 114 can forego or limit further processing of the received log data report to allow for immediate dispatch, or dispatch upon receipt of the log data report from application 112. For example, log data dispatch service 114 can forego compression of the received log data report. In another example, log data dispatch service 114 can instruct log data preprocessor 118 to compress the received log data report using a compression mechanism that is not computationally expensive in order to apply some degree of compression to the received log data report. For example, to compress the received log data report, log data dispatch service 114 can select one of a plurality of compression mechanisms based on a mapping between a prioritization level of the application log data and a compression mechanism associated with log data reports at that prioritization level.

In some aspects, when log data dispatch service 114 determines that the application context corresponds to a context other than application failure (e.g., to a normal operational mode), log data dispatch service 114 can cache the received log data report at log data cache 116 for delayed transmission to one or more of application log data repositories 120A-120C. By delaying transmission of log reports with application contexts corresponding to a context other than application failure, fewer transmissions of log data may be performed by client device 110, which may reduce network overhead, improve battery life, and reduce power usage for the client device 110 by reducing a number of times power-intensive tasks, such as the generation and transmission of data over a wireless network connection, may be performed. Generally, log data reports may be added to log data cache 116 until a defined time (e.g., such that log data reports are batched for transmission periodically), or until log data cache 116 is filled, or until log data cache 116 includes a specified number of reports. When the defined time is reached, or when log data cache 116 is filled, or when log data cache 116 includes the specified number of reports, the log data reports stored in log data cache 116 may be batched into a single payload and dispatched to one or more of application log data repositories 120A-120C. Generally, each of the log data reports in log data cache 116 are log data reports generated during normal operations, as these log data reports generally include data that need not be acted upon immediately, unlike log data reports generated for errors in the application 112.

For log data reports associated with an application context other than application failure, log data dispatch service 114 can compress the received log data report and the cached log data reports. In some aspects, the log data dispatch service 114 can determine the compression level for the log data reports based on information contained within or information about the received log data report. For example, the size of the received log data reports may be a factor in determining a compression level applied to the received log data reports. Log data reports having larger sizes may be associated with higher compression levels than the compression level used for log data reports having smaller sizes. By using different compression levels for different log reports, log data dispatch service 114 can dynamically reduce the bit size of each compressed log data report so that transmission overhead can be reduced relative to uncompressed log data reports and that larger amounts of transmission overhead are saved for larger log data reports.

Various compression mechanisms can be selected by log data dispatch service 114 and used by log data compressor 118 to generate compressed log data payloads from one or more log data reports. In some aspects, log data reports can be compressed by filtering the log data report to remove specified data defined as superfluous for error tracking, performance monitoring, or other application development purposes. In another aspect, log data payloads can be compressed by encoding the data into a specific character set, which can minimize the characters included in the log data payload. In still further examples, log data reports can be serialized into a format from which various data structures can be reconstructed. Log data dispatch service 114 can also select a compression algorithm to use in compressing the log data reports into a compressed log data payload, such as GZIP, 7zip, or the like.

In some aspects, log data compressor 118 may further compress the log data payloads from one or more log data reports using various data minimization techniques that can include data identified as significant for future use and analysis but may remove duplicative data. For example, a plurality of log data reports can be compressed into a single representative log data report including average values for each of a plurality of data points included in the log data reports (e.g., an average execution time, etc.). In another example, statistical measures may be included in a single representative log data report in lieu of transmitting a plurality of individual log data reports in a compressed payload. In this example, the single representative log data report can include statistically useful data, such as time averaged values, maximum and minimum values, average values and standard deviation information, or the like.

After determining a prioritization level and dispatch time for a log data report and applying any desired amount of compression to the log data report, log data dispatch service 114 can select the destination application log data repositories 120 for a compressed log data payload including the log data report and manage transmission and retransmission of the compressed log data payload. The destination application log data repositories 120 can be identified based on the source from which the log data report was received. In some aspects, a mapping can be established between different sources, such as specific modules within a software application, the identity of the application itself, or the like, and specific application log data repositories 120, so that log data reports are transmitted to the appropriate repositories. These defined locations can be used, for example, when the log data report does not include information specifying one or more specific log data repositories to which the log data report is to be committed (e.g., when a destination specified by the application is a null value or other reserved value).

Log data dispatch service 114 generally monitors transmission of compressed log data payloads, including log data reports to application log data repositories 120A-120C to determine whether transmission was successful. In some aspects, successful transmission of a compressed log data payload to an application log data repository 120 may be evidenced by receipt of an acknowledgment message from the destination application log repositories 120A-120C. In some aspects, log data dispatch service 114 can determine that the log data report was successfully transmitted by searching the destination application log repositories 120A-120C for the log data report. If log data dispatch service 114 identifies a match between an entry in an application log data repository 120 and the compressed log data payload, log data dispatch service 114 can determine that the log data report was successfully received.

If log data dispatch service 114 receives an indication or otherwise determines that the compressed log data payload was successfully transmitted to application log data repositories 120A-120C, log data dispatch service can flush the log data report from a cache used to temporarily store the log data reports included in the compressed log data payload. If, however, log data dispatch service 114 determines that the compressed log data payload was not successfully transmitted to application log data repositories 120A-120C, log data dispatch service 114 can attempt to retransmit the compressed log data payload. Retransmission of the compressed log data payload can continue until the compressed log data payload is successfully transmitted or until a threshold number of transmission attempts have occurred. If the threshold number of transmission attempts have occurred, the log data reports included in the compressed log data payload may be flushed from the cache regardless of whether the final transmission attempt was successful. In some aspects, the threshold number of transmission attempts may be associated with a priority level of the compressed log data payload. For example, compressed log data payloads with higher importance levels (e.g., log data payloads with In some aspects, log data dispatch service 114 can control transmission of the compressed log data payload based on various properties of the client device 110. For example, log data dispatch service 114 can determine a power state of the client device 110. If log data dispatch service 114 determines that the power state corresponds to a low battery state (e.g., that the client device 110 has a remaining battery capacity less than a threshold level and is not connected to an external power source, such as an external battery pack or line (mains) power), log data dispatch service 114 can delay transmission (or retransmission) of the compressed log data payload until the power state no longer corresponds to a low battery state. In another example, log data dispatch service 114 can monitor the network connectivity state of the client device 110. If log data dispatch service 114 determines that the network connectivity state corresponds to an unstable connectivity state or a disconnected state, log data dispatch service 114 can delay transmission (or retransmission) of the compressed log data payload until a stable network connection is established and detected.

Application log data repositories 120A-120C represent data storage repositories in which log data reports from an application 112 can be stored. Application log data repositories 120A-120C may be structured as flat data stores in which compressed log data payloads received from an application 112 via a log data dispatch service 114 can be stored as individual files, non-relational databases, relational databases, or other data storage systems in which compressed log data payloads can be stored. In some aspects, separate log data repositories can be maintained for different components of application 112 or for different applications 112. In some aspects, separate log data repositories can be maintained for different types of application log data, which may allow for critical log data reports, such as error reports, to be maintained in separate repositories from non-critical log data reports. The data stored in application log data repositories 120A-120C can be used by one or more software development systems 130, where developers of application 112 can view the log data reports and use the information contained in the log data reports to develop, test, and deploy updates to application 112.

Figure 2:
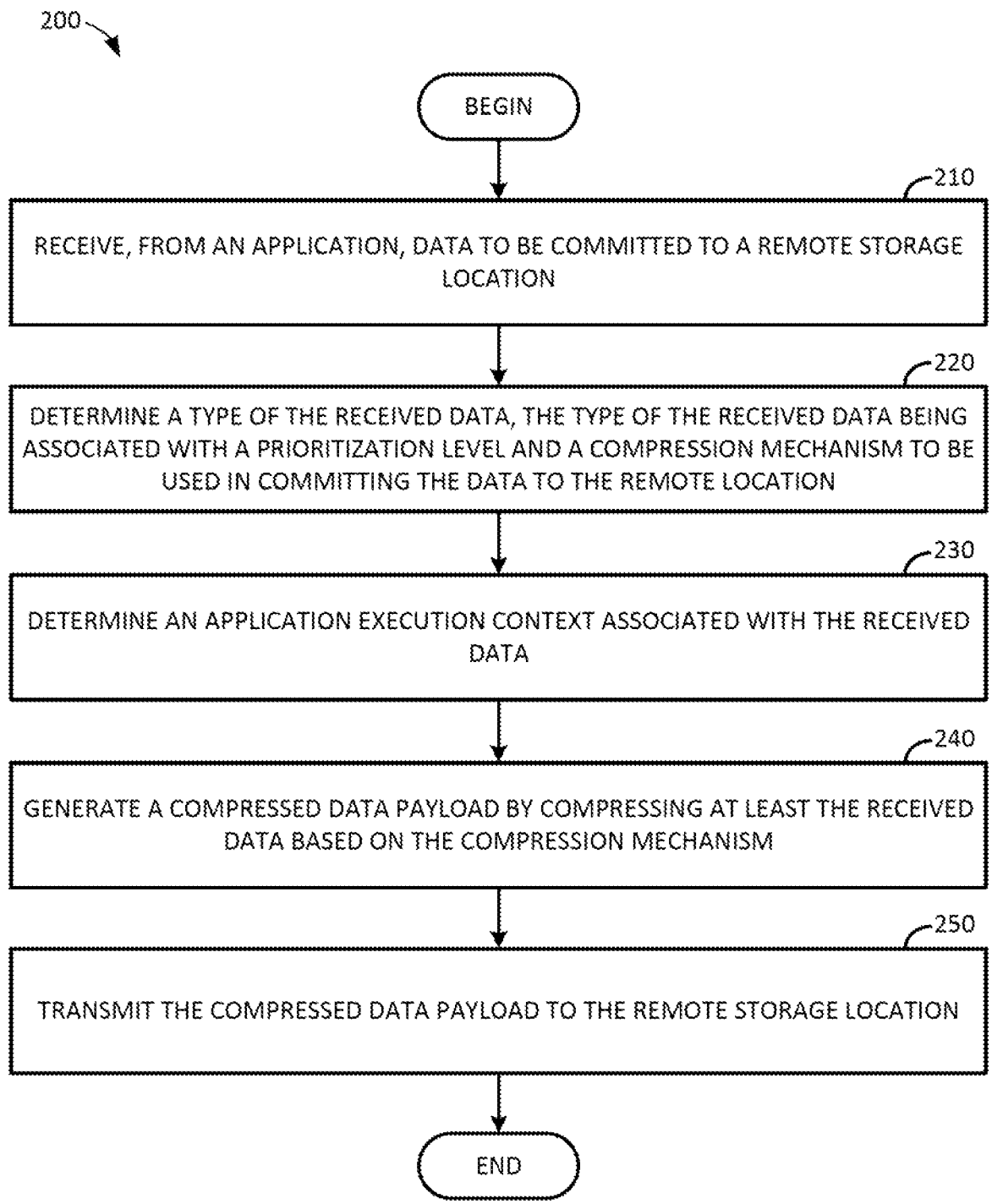
FIG. 2 illustrates example operations for generating and transmitting application log data to an application log data repository based on compression and timing associated with a type of the application log data.

Example Computer-Implemented Method for
Dynamic Compression and Transmission of
Application Log Data Reports FIG. 2 illustrates example operations 200 for dynamically compressing and transmitting application log data reports to an application log data repository. As illustrated operations 200 may be performed by log data dispatch service 114 illustrated in FIG. 1.

As illustrated, operations 200 begins at block 210, where data to be committed to a remote storage location is received from an application. The data to be committed may be various types of data about activity within an application. For example, the data may include error reports, such as memory dumps or other information generated when a handled or unhandled exception occurs within the application, performance log data, feature usage data, and other information that may be used in maintaining the application.

At block 220, the type of the received data is determined. Generally, the type of the received data may be associated with a prioritization level and a compression mechanism to be used in committing the data to the remote location, as illustrated in further detail in FIG. 3 and described below. The received data may include application log data, such as memory dumps, application telemetry data indicating features that are being used in the application, clickstream data, or the like; or may include performance data for a feature or component in the application.

At block 230, an application execution context associated with the received data is determined.

In some aspects, determining the application execution context associated with the received data may include determining whether the received data corresponds to a failure event in the application or in an application component. Determining that the received data corresponds to a failure event in the application may include determining that the received data includes one or more flags indicative of an application or application component failure (e.g., magic constants defined as an error within the application), determining that the received data includes a memory dump (e.g., by identifying memory addresses in the received data), or the like. In some aspects, determining that the received data corresponds to a failure event in the application or in an application component may include determining that performance data for a feature or component in the application corresponds to information indicating a failure of the application. For example, a failure may be defined as performance that does not fall within an expected performance level for the application or application component, such as a processing time being longer than a defined maximum processing time for a feature in the application.

At block 240, at a dispatch time associated with the prioritization level of the received data and the application execution context associated with the received data, a compressed data payload is generated. The compressed data payload may be generated by compressing at least the received data based on the compression mechanism. In some aspects, the compressed data payload may further be generated by compressing other data stored in a cache for transmission to the remote storage location.

The dispatch time generally imposes smaller delays on data having a higher importance in maintaining the application than for data having a lower importance. For example, error reports, which may be considered critical data in the application maintenance and development lifecycle, may have a highest importance and may thus be transmitted to the remote storage location with little or no delay. Less critical data in the application maintenance and development lifecycle, such as telemetry gathered during normal operations within the application, may have a delayed dispatch time to allow for other similar data to be cached and batched into a single transmission, which may reduce the overhead involved in committing such data to a remote data repository.

The received data and previously received data may be included in a compressed data payload. To compress the received data and the previously received data (if any), the size of the received data can be used in selecting the level of compression to be applied. Different sizes of data can be associated with different levels of compression so that a higher level of compression is used for larger payloads. Further, in compressing the received data, the received data can be processed using data filtering to remove extraneous data from the received data, data encoding into a defined character set to minimize the number of bits used to represent each character in the receive data, various amounts of compression loss, and serialization.

In some aspects, the compressed data payload may be generated by consolidating a plurality of individual log data reports into a single representative log data report. For example, a plurality of log data reports can be compressed into a single representative log data report including average values for each of a plurality of data points included in the log data reports (e.g., an average execution time, etc.). In another example, statistical measures may be included in a single representative log data report in lieu of transmitting a plurality of individual log data reports in a compressed payload. In this example, the single representative log data report can include statistically useful data, such as time averaged values, maximum and minimum values, average values and standard deviation information, or the like.

At block 250, the compressed data payload is transmitted to the remote storage location.

In some aspects, the compressed data payload may be transmitted to one of a plurality of remote storage locations based on information about or carried in the compressed data payload. For example, information about the application or application component from which the data was received can be used to determine the remote storage location to which the compressed data payload is to be transmitted. A defined location can be specified for the application or application component as a default or fallback destination. If the received data does not include a defined destination for a compressed data payload, the defined location can be used; otherwise, the compressed data payload can be committed to the remote storage location identified in the received data.

In some aspects, transmission of the compressed data payload may be managed based on various properties of the client device on which the application is executing, as illustrated in further detail in FIG. 4 and described below. For example, the power state of the client device can be used to determine whether to delay transmission of the compressed data payload. When the power state indicates that the remaining battery capacity of the client device is below a threshold level and that the client device is not connected to an external power source (e.g., a battery pack or line (mains) power), transmission of the compressed data payload may be delayed until the remaining battery capacity rises above the threshold level. In another example, the network connectivity state of the client device can be used to determine whether to delay transmission of the compressed data payload. Generally, transmission of compressed data payloads can be delayed until the client device has a stable network connection.

Figure 3:
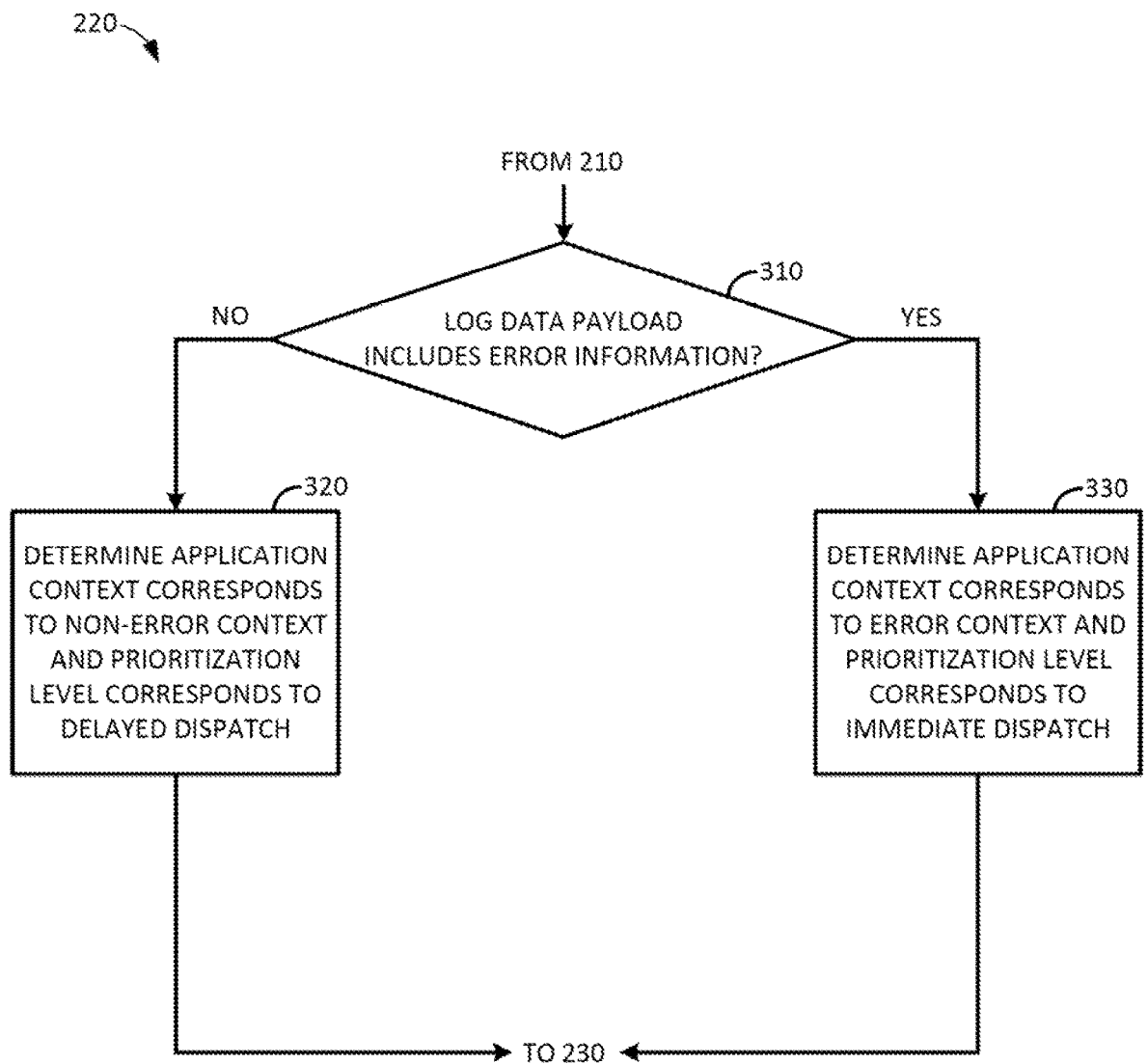
FIG. 3 illustrates example operations for determining a prioritization level for application log data.

FIG. 3 illustrates further details of block 220, in which the type of the received data is determined. Block 220 may begin at block 310, where it is determined whether the log data payload includes error information. As discussed, error information may include, for example, one or more magic constants indicative of an error (e.g., the value 0xDEADBEEF in hexadecimal), memory log information such as a stack dump or other memory trace, information identifying a specific type of error encountered during execution of an application, or the like. In another example, a determination of whether the log data payload includes error information may include determining, based on performance data included in the log data payload, that the application is not performing within a defined range of acceptable performance (e.g., execution completes after a defined maximum processing time).

If, at block 310, it is determined that the log data payload includes error information, operations 220 may proceed to block 520, where it is determined that the application context associated with the log data payload corresponds to an error context. It is further determined, based on the application context corresponding to an error context, that the prioritization level corresponds to immediate dispatch. Operations 220 may then proceed to block 230, as discussed above.

Otherwise, at block 310, it is determined that the log data payload does not include error information, operations 220 may proceed to block 530, where it is determined that the application context associated with the log data payload corresponds to a non-error context (e.g., the log data payload includes performance data not indicative of a performance issue in the application, application usage data, or the like). It is further determined, based on the application context corresponding to a non-error context, that the prioritization level corresponds to delayed dispatch. Operations 220 may then proceed to block 230, as discussed above.

Figure 4:
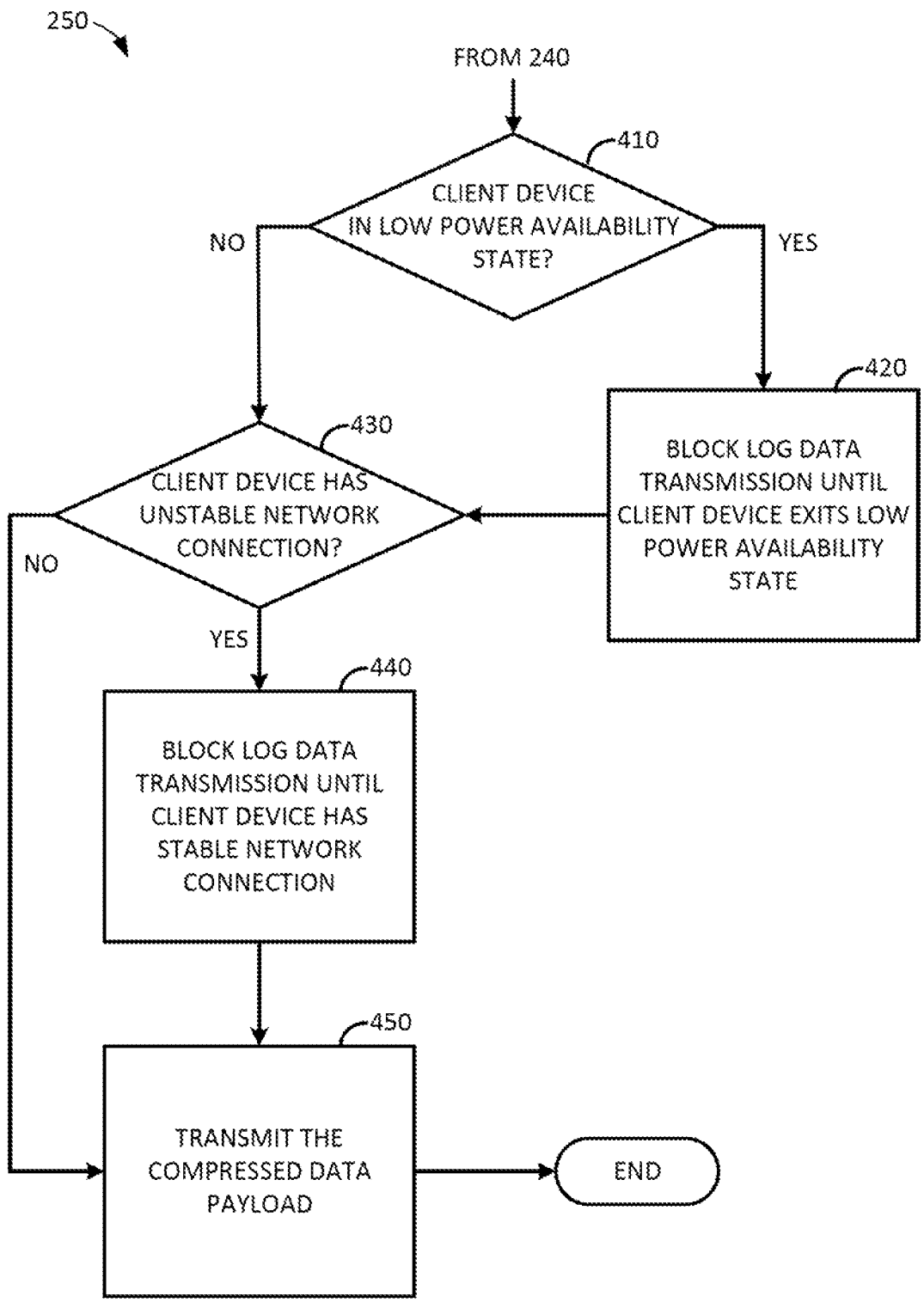
FIG. 4 illustrates example operations for managing transmission of the application log data based on device properties.

FIG. 4 illustrates further details of block 250, in which the compressed data payload is transmitted to the remote storage location. As illustrated, FIG. 4 illustrates examples in which transmission of application log data is managed based on device properties.

Block 250 may begin at block 410, in which it is determined whether the client device is in a low power availability state. In some aspects, a low power availability state may correspond to a state in which the client device has a remaining battery life less than a threshold value (e.g., a threshold minimum remaining battery charge percentage) and is not connected to an external power source (e.g., an external battery pack, mains or wall power, or other energy source through which the client device can charge its battery). If the client device is in a low power availability state, operations 250 may proceed to block 420, where log data transmission is blocked until the client device exits the low power availability state. In some aspects, exiting the low power availability state may be detected by determining that the client device is connected to an external power source. In some aspects, exiting the low power availability state may further include determining that, while the client device is connected to an external power source, the remaining battery life is greater than a threshold value (which may be the same as or different from the threshold value used to determine that the client device is in a low power availability state). After the client device exits the low power availability state, operations 250 may proceed to block 430.

If, at block 410, it is determined that the client device is not in a low power availability state, operations 250 may proceed to block 430, where it is determined whether the client device has an unstable network connection. An unstable network connection may be identified, for example, based on a signal strength measurement (e.g., a received power measurement) for a network to which the client device is connected. If the signal strength measurement is less than a threshold signal strength, the client device may be determined to have an unstable network connection. In another aspect, a client device may be determined to have an unstable network connection based on previous delivery and retransmission statistics, where a threshold number of retransmissions may be indicative of an unstable network connection. If, at block 430, it is determined that the client device has an unstable network connection, then at block 440, log data transmission may be blocked until the client device has a stable network connection. When the client device has a stable network connection, operations 250 may proceed to block 450, where the compressed data payload is transmitted.

If, at block 430, it is determined that the client device has a stable network connection, then the client device may be permitted to transmit the compressed data payload. Operations 250 may thus proceed to block 450, where the compressed data payload is transmitted.

Figure 5:
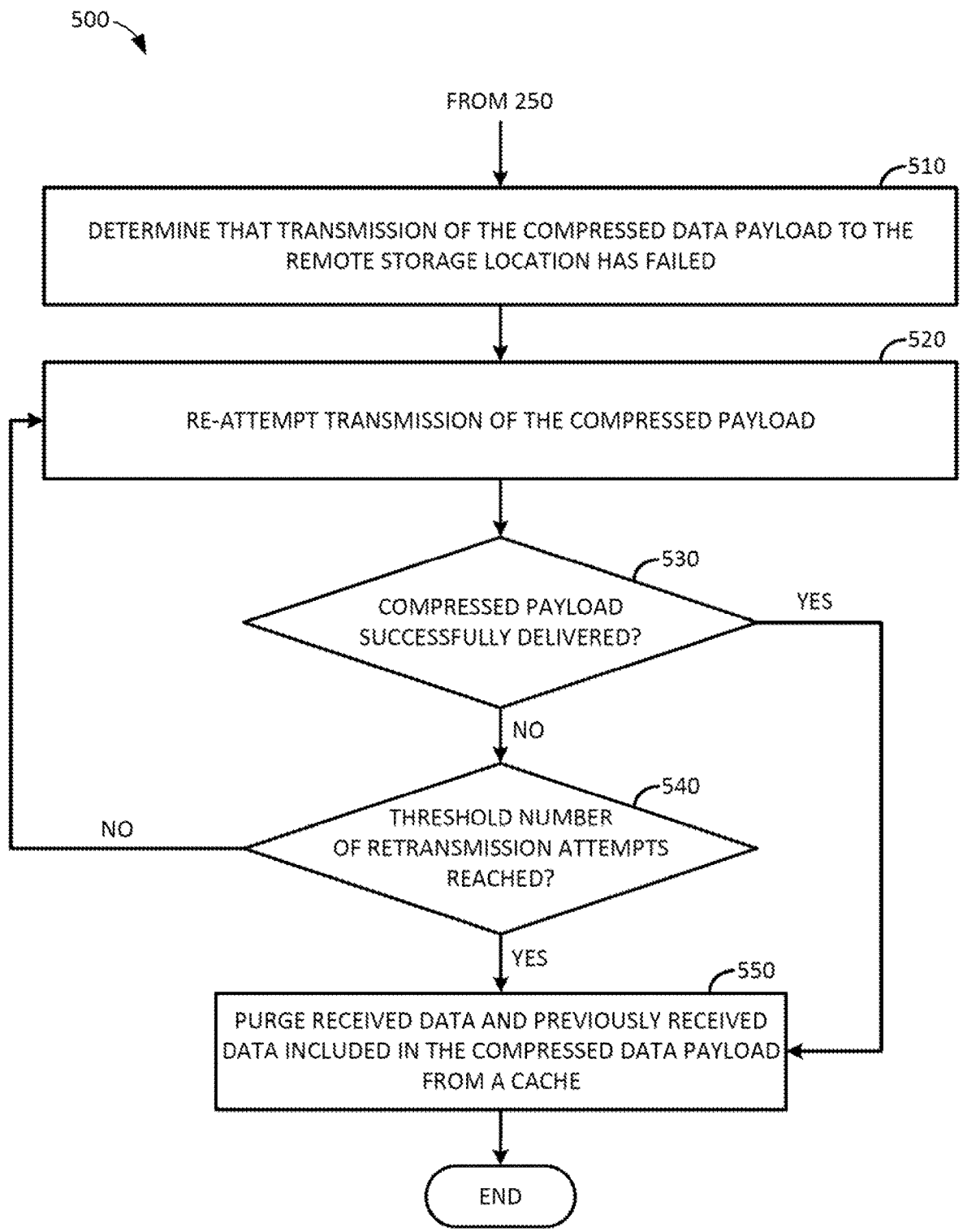
FIG. 5 illustrates example operations for retransmission of failed transmissions of application log data.

FIG. 5 illustrates further operations that may be performed to transmit application log data reports to an application log data repository. As illustrated operations 500 may be performed by log data dispatch service 114 illustrated in FIG. 1.

As illustrated, operations 500 may continue at block 510 from block 250 illustrated in FIG. 2. At block 510, it is determined that transmission of the compressed data payload to the remote storage location has failed. A failure to transmit the compressed data payload to the remote storage location may be detected based on a failure to receive an acknowledgment message from the remote storage location. In some aspects, a failure to transmit the compressed data payload to the remote storage location may be detected based on a failure to find the compressed data payload at the remote storage location after a time at which the compressed data payload is expected to be received and committed to the remote storage location.

At block 520, transmission of the compressed payload is reattempted.

At block 530, it is determined whether the compressed payload was successfully delivered. If the compressed payload was successfully delivered, operations 500 may proceed to block 550, discussed in further detail below. Otherwise, if the compressed payload was not successfully delivered, operations 500 may proceed to block 540.

At block 540, it is determined whether a threshold number of retransmission attempts has been reached. If the threshold number of retransmission attempts has not been reached, operations 500 may return to block 520 for another attempt to retry transmission of the compressed payload to the remote storage location. Otherwise, operations 500 may proceed to block 550.

At block 550, the received data and previously received data included in the compressed data payload may be removed from the cache. By removing the received data and the previously received data from the cache, data that has been successfully transmitted may be removed. Further, data that is outdated or for which the threshold number of attempts has been received may be removed from the cache so that such data is not re-transmitted, which may reduce computing resource utilization in the transmission of application log data from a client device to one or more remote storage locations.

Figure 6:
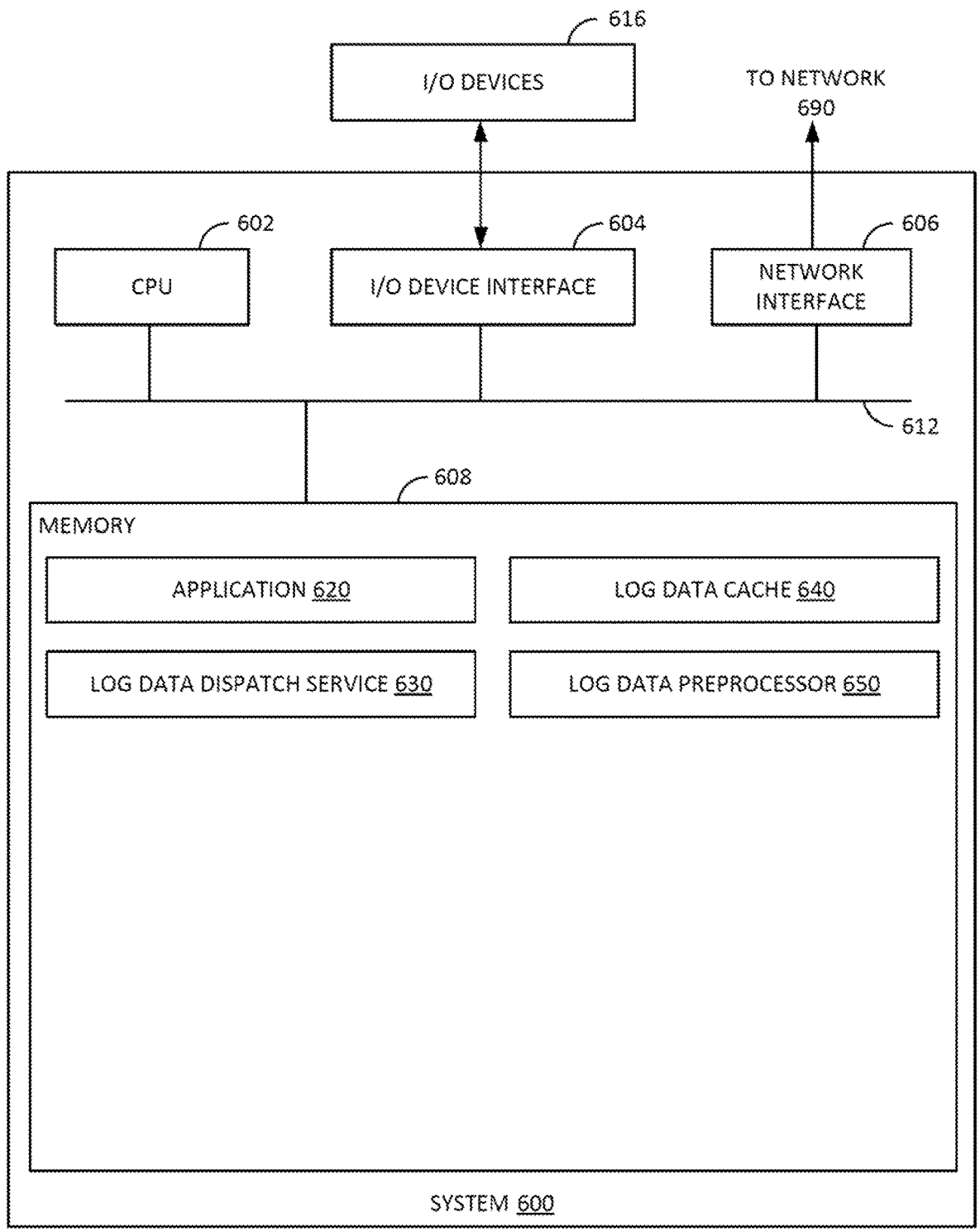
FIG. 6 illustrates an example system on which embodiments of the present disclosure can be performed.

Example Systems for Dynamic Compression and Transmission of Application Log Data FIG. 6 illustrates an example system 600 in which application log data is dynamically compressed and transmitted to an application log data repository. System 600 may correspond to client device 110 illustrated in FIG. 1 or other devices on which an application can execute and generate and transmit log data to a remote location.

As shown, system 600 includes a central processing unit (CPU) 602, one or more I/O device interfaces 604 that may allow for the connection of various I/O devices 614 (e.g., keyboards, displays, mouse devices, pen input, etc.) to the system 600, network interface 606 through which system 600 is connected to network 490 (which may be a local network, an intranet, the internet, or any other group of computing devices communicatively connected to each other), a memory 608, and an interconnect 612.

CPU 602 may retrieve and execute programming instructions stored in the memory 608. Similarly, the CPU 602 may retrieve and store application data residing in the memory 608. The interconnect 612 transmits programming instructions and application data, among the CPU 602, I/O device interface 604, network interface 606, and memory 608.

CPU 602 is included to be representative of a single CPU, multiple CPUs, a single CPU having multiple processing cores, and the like.

Memory 608 is representative of a volatile memory, such as a random access memory, or a nonvolatile memory, such as nonvolatile random access memory, phase change random access memory, or the like. As shown, memory 608 includes an application 620, a log data dispatch service 630, a log data cache 640, and a log data preprocessor 650.

Application 620 generally corresponds to application 112 illustrated in FIG. 1. Application 620 generally corresponds to an application through which user interaction through a user interface can trigger execution of one or more functions within the application. Generally, application 620 can generate log data reports and transmit the log data reports to log data dispatch service 630 for dispatch to an application log data store 640 locally or located at a remote computing resource. These log data reports may be generated in response to various events in the application, such as the occurrence of handled or unhandled exceptions or other error events in the application, expiry of log data generation timers, state transitions in application 620, and the like.

Log data dispatch service 630 generally corresponds to log data dispatch service 114 illustrated in FIG. 1. Generally, log data dispatch service 630 receives log data reports from application 620 and dispatches compressed log data payloads to an application log data store 640 or one or more remote application log data stores for storage. Generally, log data dispatch service 630 can determine a type of the received data, a prioritization level, and a compression mechanism for the received data. Based on the determined type, prioritization level, and compression mechanism, log data dispatch service 630 can instruct log data preprocessor 650 to generate a compressed log data payload from at least the received log data reports (and, in some aspects, from previously received log data reports stored in a cache, such as log data cache 640). The compressed log data payloads may then be dispatched to an application log data store, such as a remote application log data store like application log data store 120 illustrated in FIG. 1.

Log data cache 640 may correspond to log data cache 116 illustrated in FIG. 1. Generally, log data cache 640 may serve as a temporary location in which log data reports are stored for batch transmission by log data dispatch service 630. After log data reports are successfully transmitted, or after a threshold number of transmission attempts are tried for these log data reports, the log data reports may be flushed from log data cache 640.

Log data preprocessor 650 generally corresponds to log data preprocessor 118 illustrated in FIG. 1. Generally, log data preprocessor 650 uses application context, prioritization, and compression mechanism information identified by log data dispatch service 630 to preprocess log data reports before such reports are transmitted to a remote application log data repository. Log data preprocessor can strip sensitive information from log data reports (if any such information exists), anonymize log data reports, and compress log data reports based on the compression mechanism information identified by log data dispatch service 630. In some aspects, log data preprocessor 650 can consolidate a plurality of reports into a single report as part of the compression process.

Note that FIG. 6 is just one example of a system, and other systems including fewer, additional, or alternative components are possible consistent with this disclosure.

EXAMPLE CLAUSES

Clause 1: A method, comprising: receiving, from an application, data to be committed to a remote storage location; determining a type of the received data, the type of the received data being associated with a prioritization level and a compression mechanism to be used in committing the data to the remote storage location; determining an application execution context associated with the received data; and at a dispatch time associated with the prioritization level of the received data and the application execution context associated with the received data: generating a compressed data payload by compressing at least the received data based on the compression mechanism, and transmitting the compressed data payload to the remote storage location.

Clause 2: The method of Clause 1, wherein: the determined type of the received data comprises application log data, the determined application execution context associated with the received data type of the received data comprises a failure of the application, and the dispatch time associated with the prioritization level of the received data and the application execution context associated with the received data comprises immediate dispatch upon receipt of the data to be committed to the remote storage location.

Clause 3: The method of any one of Clauses 1 or 2, wherein: the data to be committed to the remote storage location comprises performance data for a feature in the application, determining the application execution context of the received data comprises determining whether the performance data for the feature in the application corresponds to information indicating a failure of the application, and the dispatch time associated with the determined type of the received data comprises immediate dispatch upon receipt of the data to be committed to the storage location.

Clause 4: The method of any one of Clauses 1 through 3, wherein: determining the application execution context of the received data comprises determining that the received data corresponds to normal operations within the application, and based on the determined type of the received data, the determined application execution context, and a determination that a current time is prior to the dispatch time associated with the determined type of the received data and the determined execution context of the received data, caching the data with previously received data corresponding to normal operations within the application.

Clause 5: The method of Clause 4, wherein generating the compressed payload comprises compressing the received data and the previously received data corresponding to normal operations.

Clause 6: The method of any one of Clauses 1 through 5, wherein the dispatch time associated with the determined type of the received data and the determined application execution context comprises a time at which a cache for the determined type of the received data reaches a defined capacity.

Clause 7: The method of any one of Clauses 1 through 6, wherein the dispatch time associated with the determined type of the received data and the determined application execution context comprises a time at which a queue containing the received data and previously received data of the determined type of the received data reaches a defined number of items.

Clause 8: The method of any one of Clauses 1 through 7, wherein determining the application execution context of the received data comprises determining that the received data corresponds to a failure of the application by parsing the received data to identify one or more data points in the received data indicative of a failure of an application component.

Clause 9: The method of any one of Clauses 1 through 8, wherein the compression mechanism is associated with a size of the received data such that a first size of the received data is associated with a first compression level and a second size of the received data is associated with a second compression level, wherein the first size is larger than the second size and the first compression level comprises a higher compression level than the second compression level.

Clause 10: The method of any one of Clauses 1 through 9, wherein the compression mechanism comprises one or more of data filtering, data encoding into a defined character set, lossless compression, or serialization.

Clause 11: The method of any one of Clauses 1 through 10, further comprising: determining that transmitting the compressed data payload to the remote storage location failed; and retrying transmission of the compressed data payload until one of receiving confirmation that the compressed data payload was successfully transmitted or reaching a threshold number of attempts to transmit the compressed data payload to the remote storage location.

Clause 12: The method of Clause 11, further comprising upon receiving confirmation that the compressed data payload was successfully transmitted or reaching a threshold number of attempts to transmit the compressed data payload to the remote storage location, purging the received data and previously received data from a cache.

Clause 13: The method of any one of Clauses 1 through 12, further comprising identifying the remote storage location as a defined location associated with a source from which the data was received.

Clause 14: The method of Clause 13, wherein transmitting the compressed data payload to the remote storage location comprises transmitting the compressed data payload to a location specified by the application or the defined location if the location specified by the application comprises a null value.

Clause 15: The method of any one of Clauses 1 through 14, further comprising: determining a power state of a device on which the application is executing; and based on determining that the power state of the device indicates that the device is not powered by mains power and a remaining battery capacity of the device is below a threshold level, delaying transmission of the compressed data payload to the remote storage location until the remaining battery capacity of the device exceeds the threshold level.

Clause 16: The method of any one of Clauses 1 through 16, further comprising: determining a network connectivity state of a device on which the application is executing; and based on determining that the network connectivity state of the device indicates that the device has an unstable network connection or is not connected to a network, delaying transmission of the compressed data payload to the remote storage location until the network connectivity state of the device indicates that the device has a stable network connection.

Clause 17: A method, comprising: receiving, from an application, data to be committed to a remote storage location; determining a type of the received data, the type of the received data being associated with a prioritization level and a compression mechanism to be used in committing the data to the remote storage location; determining an application execution context associated with the received data; at a dispatch time associated with the prioritization level of the received data and the application execution context associated with the received data: generating a compressed data payload by compressing at least the received data based on the compression mechanism, and transmitting the compressed data payload to the remote storage location; determining that transmitting the compressed data payload to the remote storage location failed; and retrying transmission of the compressed data payload until one of receiving confirmation that the compressed data payload was successfully transmitted or reaching a threshold number of attempts to transmit the compressed data payload to the remote storage location.

Clause 18: The method of Clause 17, further comprising upon receiving confirmation that the compressed data payload was successfully transmitted or reaching a threshold number of attempts to transmit the compressed data payload to the remote storage location, purging the received data and previously received data from a cache.

Clause 19: The method of any one of Clauses 17 or 18, further comprising identifying the remote storage location as a defined location associated with a source from which the data was received, wherein transmitting the compressed data payload to the remote storage location comprises transmitting the compressed data payload to a location specified by the application or the defined location if the location specified by the application comprises a null value.

Clause 20: A system, comprising: a memory having executable instructions stored thereon; and a processor configured to execute the executable instructions to perform the methods of any one of Clauses 1 through 19.

Clause 21: A system, comprising: means for performing the methods of any one of Clauses 1 through 19.

Clause 22: A computer-readable medium having instructions stored thereon which, when executed by a processor, performs the methods of any one of Clauses 1 through 19.

ADDITIONAL CONSIDERATIONS

The preceding description is provided to enable any person skilled in the art to practice the various embodiments described herein. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

A processing system may be implemented with a bus architecture. The bus may include any number of interconnecting buses and bridges depending on the specific application of the processing system and the overall design constraints. The bus may link together various circuits including a processor, machine-readable media, and input/output devices, among others. A user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media, such as any medium that facilitates transfer of a computer program from one place to another. The processor may be responsible for managing the bus and general processing, including the execution of software modules stored on the computer-readable storage media. A computer-readable storage medium may be coupled to a processor such that the processor can read information from, and write information to, the storage medium. In the alternative, the storage medium may be integral to the processor. By way of example, the computer-readable media may include a transmission line, a carrier wave modulated by data, and/or a computer readable storage medium with instructions stored thereon separate from the wireless node, all of which may be accessed by the processor through the bus interface. Alternatively, or in addition, the computer-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module, it will be understood that such functionality is implemented by the processor when executing instructions from that software module.

The following claims are not intended to be limited to the embodiments shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A method, comprising:
   receiving, from an application, data to be committed to a remote storage location;
   determining a type of the received data, the type of the received data being associated with a prioritization level and a compression mechanism to be used in committing the data to the remote storage location;
   determining an application execution context associated with the received data, wherein determining the application execution context associated with the received data comprises determining that the received data corresponds to normal operations within the application;
   based on the determined type of the received data, the determined application execution context, and a determination that a current time is prior to a dispatch time associated with the determined type of the received data and the determined execution context of the received data, caching the data with previously received data corresponding to normal operations within the application; and
   at the dispatch time associated with the prioritization level of the received data and the application execution context associated with the received data:
      generating a compressed data payload by compressing at least the received data based on the compression mechanism, and
      transmitting the compressed data payload to the remote storage location.

2. The method of claim 1, wherein:
   the determined type of the received data comprises application log data,
   the determined application execution context associated with the received data type of the received data comprises a failure of the application, and
   the dispatch time associated with the prioritization level of the received data and the application execution context associated with the received data comprises immediate dispatch upon receipt of the data to be committed to the remote storage location.

3. The method of claim 1, wherein:
   the data to be committed to the remote storage location comprises performance data for a feature in the application,
   determining the application execution context of the received data comprises determining whether the performance data for the feature in the application corresponds to information indicating a failure of the application, and
   the dispatch time associated with the determined type of the received data comprises immediate dispatch upon receipt of the data to be committed to the remote storage location.

4. The method of claim 1, wherein generating the compressed payload comprises compressing the received data and the previously received data corresponding to normal operations.

5. The method of claim 1, wherein the dispatch time associated with the determined type of the received data and the determined application execution context comprises a time at which a cache for the determined type of the received data reaches a defined capacity.

6. The method of claim 1, wherein the dispatch time associated with the determined type of the received data and the determined application execution context comprises a time at which a queue containing the received data and previously received data of the determined type of the received data reaches a defined number of items.

7. The method of claim 1, wherein determining the application execution context of the received data comprises determining that the received data corresponds to a failure of the application by parsing the received data to identify one or more data points in the received data indicative of a failure of an application component.

8. The method of claim 1, wherein the compression mechanism is associated with a size of the received data such that a first size of the received data is associated with a first compression level and a second size of the received data is associated with a second compression level, wherein the first size is larger than the second size and the first compression level comprises a higher compression level than the second compression level.

9. The method of claim 1, wherein the compression mechanism comprises one or more of data filtering, data encoding into a defined character set, lossless compression, or serialization.

10. The method of claim 1, further comprising:
determining that transmitting the compressed data payload to the remote storage location failed; and
retrying transmission of the compressed data payload until one of receiving confirmation that the compressed data payload was successfully transmitted or reaching a threshold number of attempts to transmit the compressed data payload to the remote storage location.

11. The method of claim 10, further comprising upon receiving confirmation that the compressed data payload was successfully transmitted or reaching a threshold number of attempts to transmit the compressed data payload to the remote storage location, purging the received data and previously received data from a cache.

12. The method of claim 1, further comprising identifying the remote storage location as a defined location associated with a source from which the data was received.

13. The method of claim 12, wherein transmitting the compressed data payload to the remote storage location comprises transmitting the compressed data payload to a location specified by the application or the defined location if the location specified by the application comprises a null value.

14. The method of claim 1, further comprising:
determining a power state of a device on which the application is executing; and
based on determining that the power state of the device indicates that the device is not powered by mains power and a remaining battery capacity of the device is below a threshold level, delaying transmission of the compressed data payload to the remote storage location until the remaining battery capacity of the device exceeds the threshold level.

15. The method of claim 1, further comprising:
determining a network connectivity state of a device on which the application is executing; and
based on determining that the network connectivity state of the device indicates that the device has an unstable network connection or is not connected to a network, delaying transmission of the compressed data payload to the remote storage location until the network connectivity state of the device indicates that the device has a stable network connection.

16. A method, comprising:
receiving, from an application, data to be committed to a remote storage location;
determining a type of the received data, the type of the received data being associated with a prioritization level and a compression mechanism to be used in committing the data to the remote storage location;
determining an application execution context associated with the received data wherein determining the application execution context associated with the received data comprises determining that the received data corresponds to normal operations within the application;
based on the determined type of the received data, the determined application execution context, and a determination that a current time is prior to a dispatch time associated with the determined type of the received data and the determined execution context of the received data, caching the data with previously received data corresponding to normal operations within the application;
at the dispatch time associated with the prioritization level of the received data and the application execution context associated with the received data:
generating a compressed data payload by compressing at least the received data based on the compression mechanism, and transmitting the compressed data payload to the remote storage location;
determining that transmitting the compressed data payload to the remote storage location failed; and
retrying transmission of the compressed data payload until one of receiving confirmation that the compressed data payload was successfully transmitted or reaching a threshold number of attempts to transmit the compressed data payload to the remote storage location.

17. The method of claim 16, further comprising upon receiving confirmation that the compressed data payload was successfully transmitted or reaching a threshold number of attempts to transmit the compressed data payload to the remote storage location, purging the received data and previously received data from a cache.

18. The method of claim 16, further comprising identifying the remote storage location as a defined location associated with a source from which the data was received, wherein transmitting the compressed data payload to the remote storage location comprises transmitting the compressed data payload to a location specified by the application or the defined location if the location specified by the application comprises a null value.

19. A system, comprising:
a memory having executable instructions stored thereon; and
a processor configured to execute the executable instructions to cause the system to:
receive, from an application, data to be committed to a remote storage location;
determine a type of the received data, the type of the received data being associated with a prioritization level and a compression mechanism to be used in committing the data to the remote storage location;
determine an application execution context associated with the received data, wherein to determine the application execution context associated with the received data, the processor is configured to cause the system to:
  determine that the received data corresponds to normal operations within the application;
  based on the determined type of the received data, the determined application execution context, and a determination that a current time is prior to a dispatch time associated with the determined type of the received data and the determined execution context of the received data, cache the data with previously received data corresponding to normal operations within the application; and
at the dispatch time associated with the prioritization level of the received data and the application execution context associated with the received data:
  generate a compressed data payload by compressing at least the received data based on the compression mechanism, and
  transmit the compressed data payload to the remote storage location.

\* \* \* \* \*